United States Patent
Pasotti et al.

(10) Patent No.: US 6,282,125 B1
(45) Date of Patent: Aug. 28, 2001

(54) METHOD FOR ERASING AND REWRITING NON VOLATILE MEMORY CELLS AND PARTICULARLY FLASH CELLS

(75) Inventors: Marco Pasotti, S. Martino Sicc.; Giovanni Guaitini, Trecella; Pier Luigi Rolandi, Monleale, all of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/553,526

(22) Filed: Apr. 20, 2000

(30) Foreign Application Priority Data

Apr. 23, 1999 (IT) .............................. MI99A0859

(51) Int. Cl.⁷ .................................... G11C 16/04
(52) U.S. Cl. ................ 365/185.29; 365/185.22; 365/185.19
(58) Field of Search ......................... 365/185.29, 185.22, 365/185.19

(56) References Cited

U.S. PATENT DOCUMENTS 5,555,204 * 9/1996 Endoh et al. .................. 365/185.22

* cited by examiner

*Primary Examiner*—Huan Hoang
(74) *Attorney, Agent, or Firm*—Wolf, Greenfield & Sacks, P.C.; James H. Morris; Theodore E. Galanthay

(57) ABSTRACT

A method for erasing non volatile memories, in particular flash cells, that includes applying erasing pulses to the cells to be erased and to verify, after each pulse, the value of the threshold voltage of the cells. The erasing pulses are provided to the cells as long as the respective values of the threshold voltage are greater than the new values of threshold voltage corresponding to new data to be rewritten in the cells to be erased.

16 Claims, 5 Drawing Sheets

METHOD FOR ERASING AND REWRITING NON VOLATILE MEMORY CELLS AND PARTICULARLY FLASH CELLS

BACKGROUND OF THE INVENTION

1. Field of the Invention

The present invention concerns a method for erasing and rewriting non volatile memory cells and particularly bilevel or multilevel flash cells.

2. Discussion of the Related Art

As known the operation of erasing in flash memories consists in extracting all the charges that are trapped in the floating gate of each cell by means of the application of one or more erasing pulses. This operation is carried out by applying a positive voltage on the source terminal, or in more sophisticated technologies, on the bulk one and a negative voltage (or null) on the gate in a such way so as to bring the value of the associated threshold voltage back to a low level and equal for all cells (erased level). The flash memory, for the way it is conceived, does not allow the erasing of the single cell, since in order to increase the cell density the source and bulk terminals of the single cells are shared. At the current state of the art the matrix of the flash memory is divided into sectors, each one of which is erasable independently from the others.

On the other hand, after the erasing operation, in order to allow a correct data storage operation, in particular if the memory is of multilevel type, it is necessary, in first place not to get any cell in depletion (too low threshold) and, in second place, that at the end of the process, all cells have a threshold voltage lower than a certain value (otherwise it would be confused with the first useful level). In addition, at the end of the process, all the thresholds of the cells to be erased must be within a not too wide interval of values.

However the presence from cells that, at each erasing pulse, modify their threshold voltage too little (slow in erasing cells) and of cells that modify it in an excessive way (fast in erasing cells), in addition to cells that behave in a correct way, does not allow to meet the above indicated requirements.

At present the operation of erasing is carried out by providing pulses with a preset length that are followed by a stage of verification of the erasing on all cells of the sector to be erased, or at least on a subset of cells (usually, all belonging to a entire row of the sector on which the operation is carried out), if particular circuit solutions that allow the selective erasing of a subset of cells are used. If only one cell of the sector or of the subset (that is of the row) in question does not pass the stage of verification because it has a threshold higher than a first preset value, a new pulse of erasing is given. When all cells of the sector or of the subset pass the stage of erasing the whole sector or subset is then controlled in order to verify that the thresholds are not lower than a second preset value until a percentage near 100% (for instance 98%) with positive result is reached. At the end of the stage of erasing, a soft programming pulse for a determined time is given to all cells.

This method requires considerable time because, by doing so even one cell that is too slow to be erased influences the duration of the erasing of the entire block and in addition it has a disadvantage from the point of view of power consumption, since some energy is required in order to discharge and to reprogram, to the desired level, all cells of the flash memory.

SUMMARY OF THE INVENTION

In view of the state of the art above described an object of the present invention is to provide a method for erasing memory cells that would allow a reduction of the erasing time and to save energy.

According to the present invention this and other objects are achieved by means of a method for erasing non volatile memories, particularly flash cells, that applies erasing pulses to the cells to be erased and verifies, after each pulse, the value of the threshold voltage of the cells. Said erasing pulses are provided to the cells as long as the respective values of the threshold voltage are greater than the new values of threshold voltage corresponding to new data to be rewritten in the cells to be erased.

Usually when erasing, the value that will have to be rewritten in the cell is not known and since the mechanism of programming can only increase the threshold, the starting point must be as low as possible.

In the case under examination that is not true any more, since for certain applications, the value to be rewritten is known beforehand. It is possible to take advantage of this through a statistic reasoning. In fact among the cells that must be reprogrammed some are at a lower level than the one to be reprogrammed at, and therefore these do not need to be erased, whereas other ones are at a slightly higher level than the one at which they must be reprogrammed, and therefore a partial erasing is necessary, other ones are exactly at the level at which they must be reprogrammed, and therefore no intervention must be carried out, and, finally, other ones (worst case), since they are at a higher level they must have the lowest level after the reprogramming stage.

Therefore part of the cells requires only a partial erasing unless all cells that are programmed at the highest logic level must be rewritten at the lowest logic level.

In this way in several cycles of erasing and rewriting, the distribution of the speed of erasing of the single cells as regards the required lowering of the threshold is half way between the worst case and the best case. This implies that the time necessary, for all the conditions to be met, is lower.

As a result of the present invention, a method for erasing and rewriting non volatile memory cells faster and less expensive in terms of energy than the traditional methods is provided.

BRIEF DESCRIPTION OF THE DRAWINGS

The characteristics and the advantages of the present invention will become evident in the following detailed description of an embodiment thereof, that is illustrated as a non limiting example in the enclosed drawings, in which.

DETAILED DESCRIPTION

Figure 1:
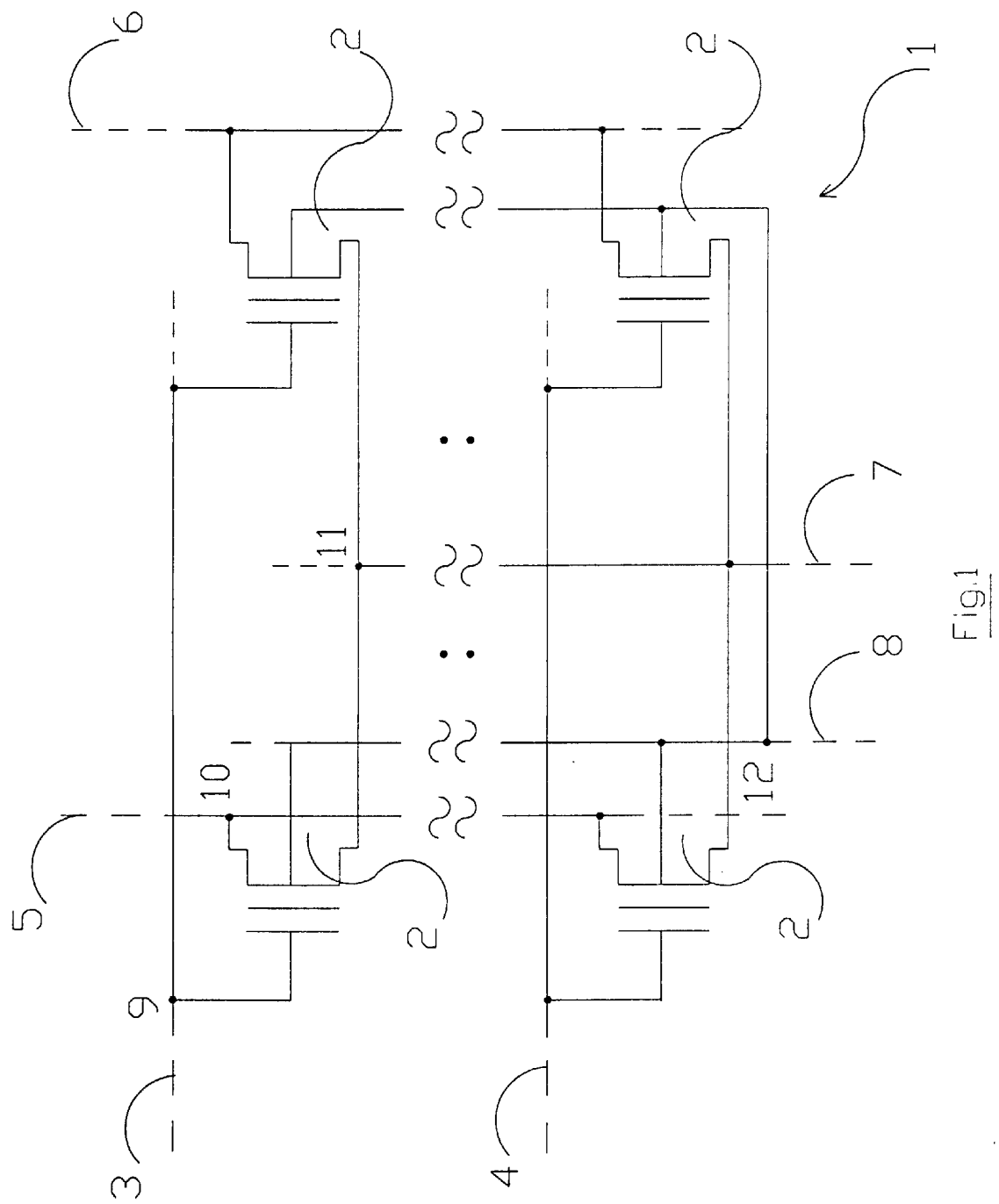
FIG. 1 shows a circuit layout of a sector of a flash cells matrix.

In FIG. 1 a simplified electric layout of a sector of non volatile memory and in particular a sector of a flash memory is indicated by 1, as a complex.

According to what illustrated in such figure it is possible to notice a plurality of cells 2; a first and a second horizontal path 3,4, called rows, separate from each other and arranged in parallel; a third and fourth vertical path 5,6, called columns, separate from each other and arranged in parallel; a vertical path 7, called shared source; a vertical path 8, called shared bulk.

Each cell 2 is substantially made up of a transistor having the gate electrode 9 connected with the row, the drain electrode 10 connected with the column, the source electrode 11 connected with the shared source line, the bulk electrode 12 connected with the shared bulk line.

The layout 1 is characterized in that the cells 2 of a same row 3 (or 4) share the gate electrode 9, the ones of a same column 5 (or 6) share the drain electrode 10, and all the cells 2 shares the source electrode 11 and the bulk electrode 12.

Figure 2:
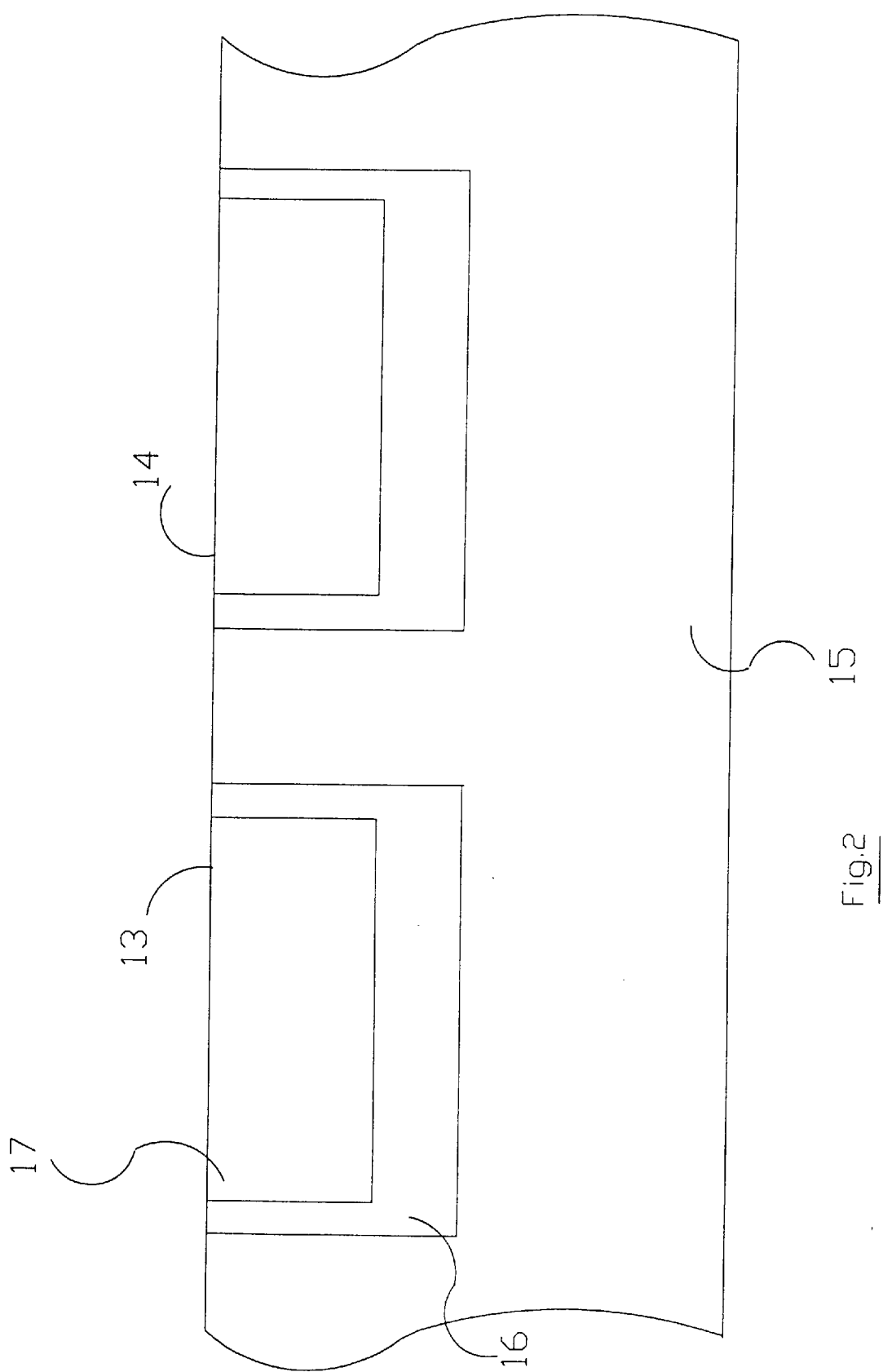
FIG. 2 schematically shows a section of a portion of the flash memory.

In FIG. 2 the section with more type 1 sectors of the flash memory is illustrated.

According to that illustrated in such figure it is possible to notice two sectors 13,14 that are separate from each other; a substrate 15 of the type p that is shared for the sectors 13,14.

Each sector 13 (or 14) is made up of an n type pocket 16 inside which an additional p type pocket 17 is made, that make up a known type structure, called "triple well."

In the section of FIG. 2 the sectors 13,14 are distinct from each other because each one has a distinct shared source line 7 and in addition because the substrate of 13 (or 14) is isolated from the other ones by means of the n type "triple well" structure.

The way in which the flash memory sector 1 works is as follows.

The stage of erasing on the entire flash memory sector is obtained by increasing the voltage of the shared bulk path 8, while lowering the voltage on the row path 3,4 and leaving the drain electrodes floating, that is leaving the paths 5,6 at high impedance. The erasing of the entire sector must be carried out according to an algorithm that allows prevention of the phenomenon of emptying (depletion) of the cells 2.

The selective erasing functionality, that is the erasing of a subgroup of rows of a sector, can be obtained by piloting the signals of the paths 3,4, in such a way that only the voltage of a row, for instance 3 (or 4) gets lowered (difference in the potential of the selected row −8V) and simultaneously the voltage of all the gate electrodes 9 of the other row 4 (or 3) is brought to the level of the voltage of the shared bulk path 8, while leaving that the shared source path 7 is floating or at the same voltage of the shared bulk path 8 (difference in potential of the non-selected row +8V). In this way the cells 2 of the row 3 (or 4) are in the conditions for the erasing, while the other cells 2 could not be erased, since the difference in potential between gate electrode 9 and path of shared bulk 8 is null. The fact that the drain electrodes 10 are floating, that is at high impedance, does not allow the flow of power in the cells 2 that are not being selected, it assures, in addition, that there is no undesirable programming due to the "hot electrons" phenomenon.

Figure 3:
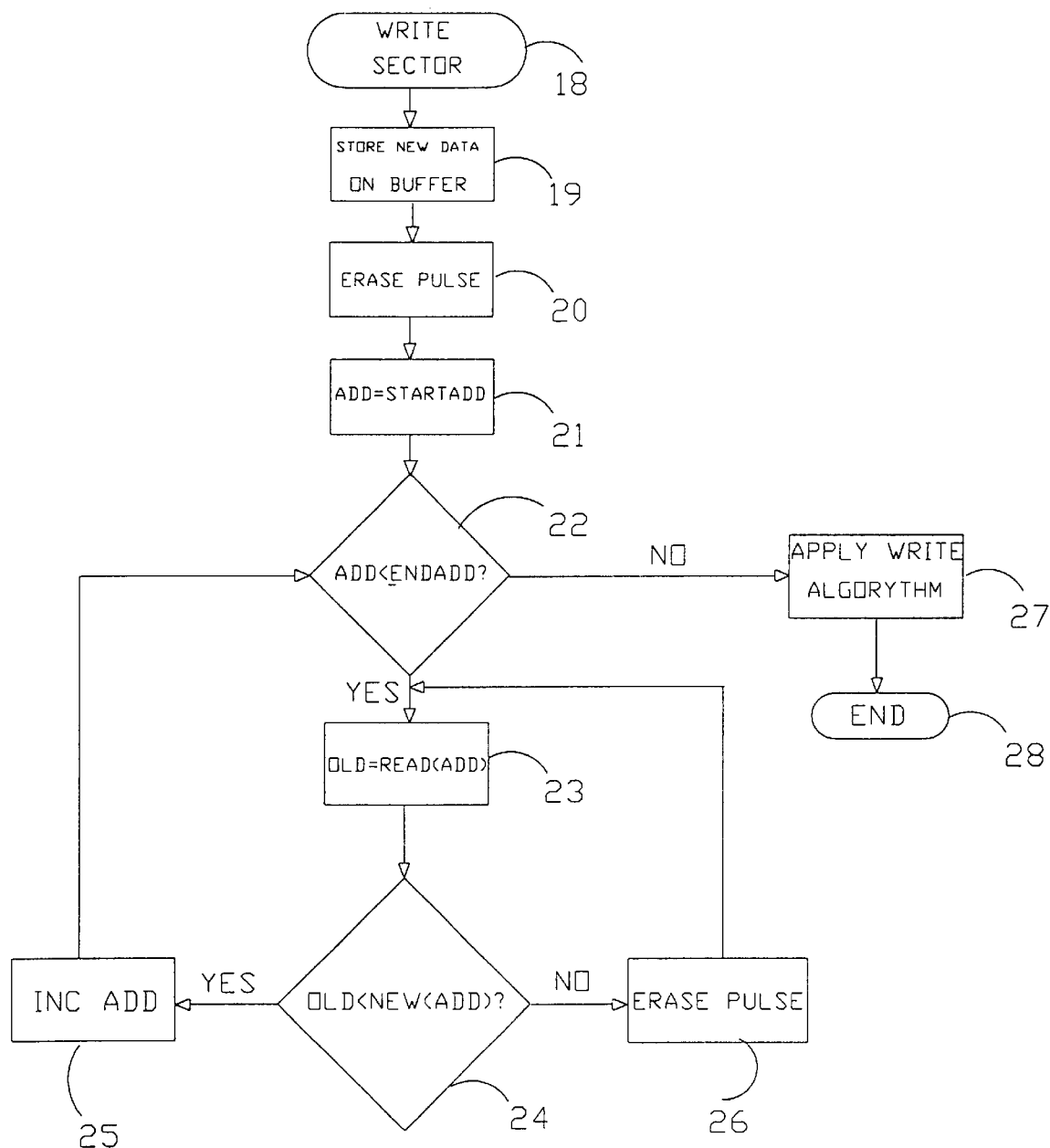
FIG. 3 shows a flow chart relative to the method of erasing according to the invention.

Given such premises the method for the erasing and rewriting, with reference to FIG. 3 and to the electric scheme of FIG. 1 will now be described, with reference to the erasing of single row.

According to that illustrated in such figure it is possible to notice an initial block 18, called "WRITE SECTOR" and a final block 28, called "END"; seven processing blocks 19,20,21,23,25,26,27 that are distinct from each other; two decision blocks 22,24 distinct from each other.

Initially, block 19, the new information are stored in a buffer ("STORE NEW DATA ON BUFFER"). The size of the buffer depends on the dimensions of the package of data that must be reprogrammed.

Therefore, block 20, a pulse of erasing ("ERASE PULSE") is applied. To this purpose, according to the principle previously described in FIG. 1, a first pulse of erasing is given for a preset time of 10 ms. Therefore a stage of verification of the low threshold, that is that the threshold is lower than a first Vth value, is carried out. The block 20 is not essential in the carrying out of the erasing and rewriting operation according to the invention and it can therefore also be omitted without invalidating the correct execution of the algorithm.

Afterwards, block 21, a stage of assignment in which the initial address ("STARTADD") of the memory block to be erased is placed in a variable of support ("ADD") is carried out as described in detail later with reference to FIG. 4.

Therefore, decision block 22 ("ADD<ENDADD"?), a stage of comparison between the address that is stored in the variable of support "ADD," block 21 and the address of the memory cell that concludes the memory block to be erased ("ENDADD") takes place, as described in detail later with reference to FIG. 4; in case the two addresses coincide (outcome NO from the block 22) the algorithm of writing, block 27 ("APPLY WRITE ALGORYTHM") is carried out, and therefore the procedure ends, block 28 ("END"); in case the two addresses do not coincide (outcome YES from the block 22) the operation of reading of the value contained in the cell of support "ADD" and memorised in another support variable "OLD," block 23 ("OLD=READ (ADD)") is carried out.

Afterwards, decision block 24, a stage of verification ("OLD<NEW (ADD)"), between the value contained in the cell "NEW," belonging to the buffer, as described in detail later with reference to FIG. 5, with address indicated by the variable of support "ADD," and the value contained in the variable "OLD" is carried out. The criterion that each cell must meet is to be at a level lower than the one that will have to be rewritten. In this way, since statistically, a certain number of cells are already in the situation of having a lower level than the one at which they must be reprogrammed, they, will therefore not need to be erased; only those cells that have not been able to erase adequately, that is that are at a level higher than the one that will have to be rewritten, must be submitted to an additional erasing pulse. In the case in which the value of the voltage is higher than the one to be rewritten (outcome NO of the block 24) another erasing pulse will be applied, block 26 ("ERASE PULSE"), and the level of the threshold voltage of the cell at subject is verified until this voltage is lower than the level that will have to be rewritten (outcome YES of the block 24); if this condition is verified, that is the level of the threshold voltage is lower than the one to be reprogrammed, an increase in the address contained in the variable of support "ADD," block 25 ("INC ADD") is carried out, which is followed by the verification of the addresses, carried out in the block of decision 22 ("ADD<ENDADD"?).

Figure 4:
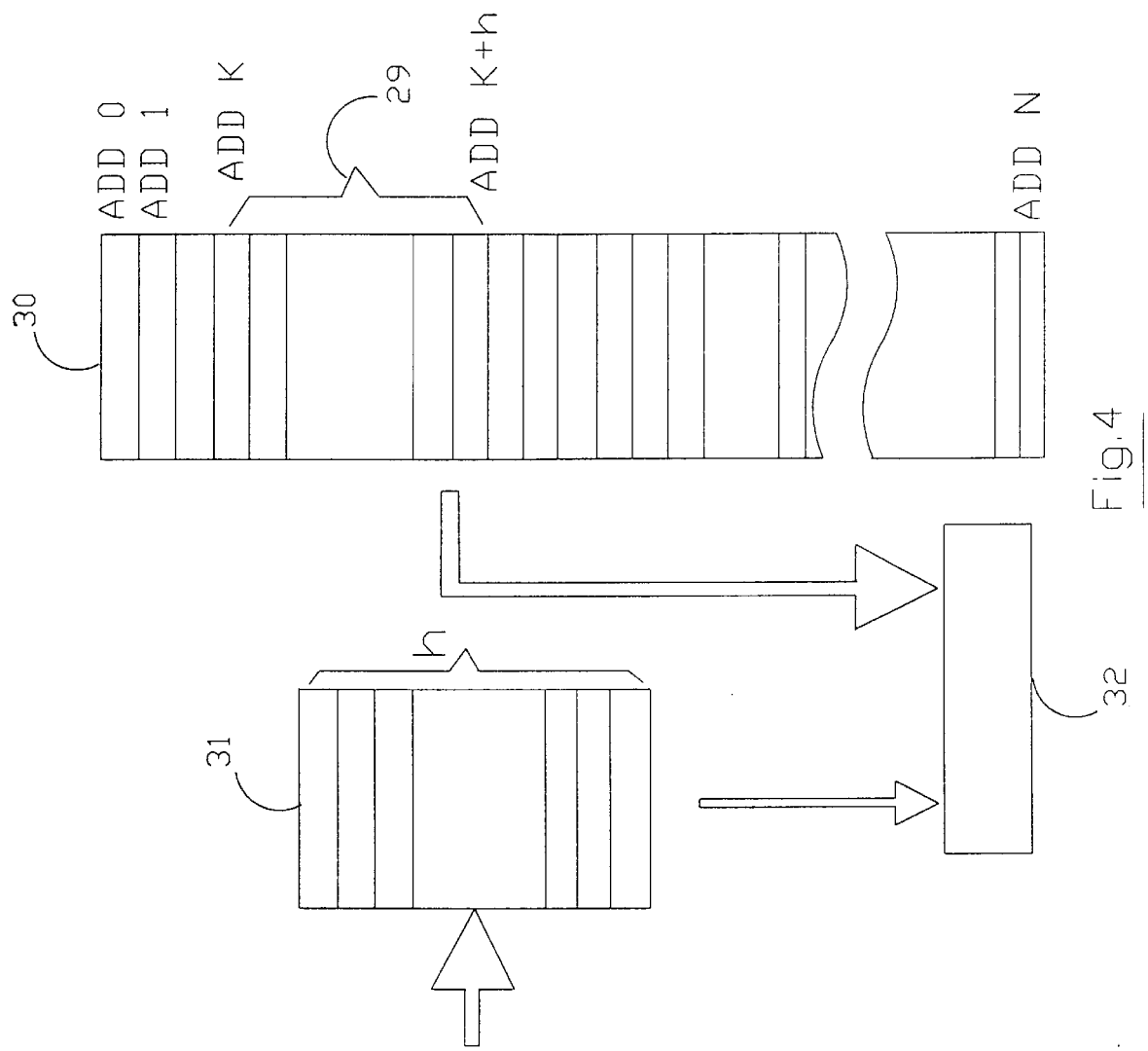
FIG. 4 schematically illustrates the memory and a buffer containing the new data to be programmed in the memory.

In FIG. 4 a representation of the decision block 22 ("ADD<ENDADD"?) is illustrated.

According to that illustrated in such figure it is possible to observe a portion 29 of the memory subset 30, that is compared with the new data present in the buffer 31; a block 32 suitable to the comparison of the data.

Figure 5:
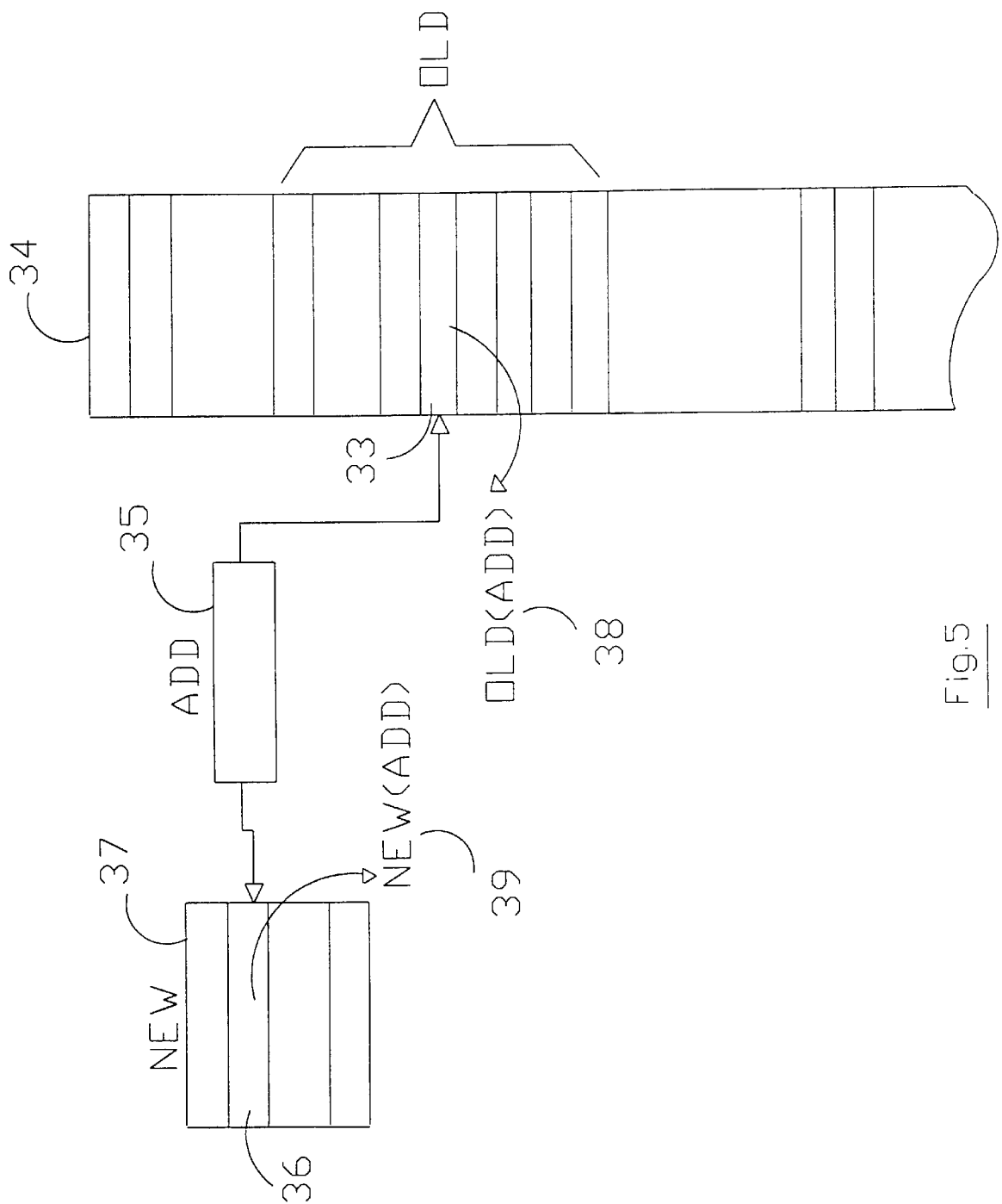
FIG. 5 shows a memory cell that is compared with a corresponding cell of the buffer containing the new data, according to the method of the present invention.

In FIG. 5 a representation of the block of decision 24 ("OLD<NEW (ADD)"?) is illustrated.

According to that illustrated in such figure it is possible to observe a cell 33 of the sector or of the memory subset 34, whose address is placed in a variable of support "ADD" 35, that is compared with the corresponding cell 36 of the buffer 37 containing the new data to be rewritten; a cell of the portion of memory on which the instruction 38 ("OLD (ADD)") operates; a cell of the buffer on which the instruction 39 ("NEW (ADD)") operates.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. Method for erasing non volatile memories, particularly flash cells, comprising applying erasing pulses to the cells to be erased and verifying, after each pulse, the value of the threshold voltage of the cells, and providing the erasing pulses to the cells as long as the respective values of the threshold voltage are greater than new values of threshold voltage corresponding to new data to be written in the cells.

2. Method according to claim 1, further comprising steps of storing new data in a buffer, and comparing the values of the threshold voltage of the cells to be erased with the values corresponding to the new data stored in the buffer.

3. Method according to claim 2, wherein after storing the new data in the buffer, further comprising steps of:
   (a) applying an erasing pulse to a first location of a portion of memory;
   (b) comparing the values of the threshold voltage of said first location with the values corresponding to data contained in a first location of the buffer;
   (c) repeating steps (a) and (b) until the values of the threshold voltage of the cells of said first location become equal or less than said corresponding values; and
   (d) repeating steps (a), (b), and (c) for all subsequent locations of the portion of memory.

4. Method according to claim 3, further comprising a step of initially applying an erasing pulse to all the cells of the portion of memory.

5. A method for erasing a block of cells in a memory before programming new data into the block of cells, comprising the steps of:
   (a) applying an erasing pulse to the block of cells;
   (b) comparing threshold voltage levels of the block of cells with the threshold voltage levels corresponding to programming of the new data; and
   (c) repeating steps (a) and (b) until the threshold voltage levels of the block of cells are no greater than a predetermined voltage level such that the new data can be programmed.

6. The method according to claim 5, wherein the block of cells is one of a number of independently addressable blocks of cells to be erased; and steps (a)–(c) are applied to the number of independently addressable blocks of cells sequentially.

7. The method according to claim 6, further comprising a step of applying an erasing pulse to cells of the blocks of cells.

8. The method according to claim 7, wherein step (c) including repeating steps (a) and (b) results in the threshold voltage levels of the block of cells to be less than or equal to the threshold voltage levels corresponding to programming of the new data.

9. A method for erasing a block of cells in a memory before programming new data into the block of cells, comprising the steps of:
   providing erasing pulses to the cells as long as the threshold voltage levels are greater than the threshold voltage levels corresponding to the new data to be programmed.

10. The method according to claim 9, wherein the block of cells is one of a number of independently addressable blocks of cells to be erased; and the step of providing erasing pulses is applied to the number of independently addressable blocks of cells sequentially.

11. The method according to claim 10, further comprising a step of initially applying an erasing pulse to cells of the blocks of cells.

12. The method according to claim 11, wherein the step of providing erasing pulses is applied until the threshold voltage levels of the block of cells are less than or equal to the threshold voltage levels corresponding to programming of the new data.

13. A method for erasing non volatile flash memory cells by applying erasing pulses to the cells to be erased and by verifying, after each pulse, the value of the threshold voltage of the cells, the method comprising:
   providing the erasing pulses to the cells as long as the values of the threshold voltage are greater than new values of threshold voltage corresponding to new data to be stored in the cells.

14. The method according to claim 13, wherein the block of cells is one of a number of independently addressable blocks of cells to be erased; and the step of providing erasing pulses is applied to the number of independently addressable blocks of cells sequentially.

15. The method according to claim 14, further comprising a step of initially applying an erasing pulse to cells of the blocks of cells.

16. The method according to claim 15, wherein the step of providing erasing pulses is applied until the threshold voltage levels of the block of cells are less than or equal to the threshold voltage levels corresponding to programming of the new data.

* * * * *